(12) United States Patent
Sasaki et al.

(10) Patent No.: US 10,050,191 B2
(45) Date of Patent: Aug. 14, 2018

(54) OXIDE PARTICLES, PIEZOELECTRIC ELEMENT, AND METHOD FOR PRODUCING OXIDE PARTICLES

(71) Applicant: FUJIFILM Corporation, Tokyo (JP)

(72) Inventors: Tsutomu Sasaki, Ashigara-kami-gun (JP); Masayuki Suzuki, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 441 days.

(21) Appl. No.: 14/835,371

(22) Filed: Aug. 25, 2015

(65) Prior Publication Data

US 2015/0364674 A1    Dec. 17, 2015

Related U.S. Application Data

(63) Continuation of application No. PCT/JP2014/051698, filed on Jan. 27, 2014.

(30) Foreign Application Priority Data

Feb. 26, 2013    (JP) ................................. 2013-035654

(51) Int. Cl.
*C01G 21/02*    (2006.01)
*H01L 41/187*    (2006.01)
(Continued)

(52) U.S. Cl.
CPC ........ *H01L 41/1876* (2013.01); *C01G 25/006* (2013.01); *C04B 35/491* (2013.01); *C30B 7/10* (2013.01); *C30B 28/04* (2013.01); *C30B 29/32* (2013.01); *C30B 29/60* (2013.01); *H01L 41/183* (2013.01); *H01L 41/39* (2013.01);
(Continued)

(58) Field of Classification Search
CPC ... H01L 41/1876; H01L 41/183; H01L 41/39; C01G 25/006; C30B 29/32; C30B 29/60; C30B 28/04; C04B 35/491; C01P 2004/61; C01P 2004/62; Y10T 428/2982
See application file for complete search history.

(56) References Cited

U.S. PATENT DOCUMENTS

| 8,410,668 B2 | 4/2013 | Koizumi et al. | |
| 2011/0014362 A1* | 1/2011 | Koizumi | ............... C04B 35/493 427/100 |
| 2012/0104309 A1* | 5/2012 | Koizumi | ............... B82Y 30/00 252/62.9 PZ |

FOREIGN PATENT DOCUMENTS

| JP | 2011-37696 A | 2/2011 |
| JP | 2011-251861 A | 12/2011 |

OTHER PUBLICATIONS

Ichihara et al, "Hydrothermal Synthesis of PZT Crystalline Pwofder and Piezoelectric Propetry of Ceramics", Journal of the Ceramic Society of Japan, Feb. 1990, vol. 98, No. 2, pp. 150-155.*
Cho et al. "Hydrothermal synthesis of acicular lead zirconate titanate (PZT)", Journal of Crystal Growth 226 (2001) 313-326.
(Continued)

*Primary Examiner* — Carol M Koslow
(74) *Attorney, Agent, or Firm* — Birch, Stewart, Kolasch & Birch, LLP

(57) ABSTRACT

The present invention provides oxide particles having a compositional formula of $Pb(Zr_xTi_{1-x})O_3$, wherein x is $0.46 \leq x \leq 0.6$; wherein a size of the particle is from 0.5 to 10 μm; a porosity of a surface of the particle is 20% or less; and a shape of the particle is any one of a cube, a rectangular parallelepiped, or a truncated octahedron.

19 Claims, 5 Drawing Sheets

(51) Int. Cl.
*C30B 28/04* (2006.01)
*C04B 35/491* (2006.01)
*H01L 41/39* (2013.01)
*C01G 25/00* (2006.01)
*C30B 7/10* (2006.01)
*C30B 29/32* (2006.01)
*H01L 41/18* (2006.01)
*C30B 29/60* (2006.01)

(52) U.S. Cl.
CPC ...... *C01P 2004/03* (2013.01); *C01P 2004/61* (2013.01); *C01P 2004/62* (2013.01); *C04B 2235/52* (2013.01); *C04B 2235/522* (2013.01); *C04B 2235/5252* (2013.01); *C04B 2235/5436* (2013.01); *C04B 2235/5445* (2013.01); *Y10T 428/2982* (2015.01)

(56) References Cited

OTHER PUBLICATIONS

Ichihara et al. "Hydrothermal Synthesis of PZT Crystalline Powder and Piezoelectric Property of Ceramics", Journal of the Ceramic Society of Japan, Feb. 1, 1990, vol. 98, No. 2, pp. 150-155.
International Search Report, issued in PCT/JP2014/051698, dated Apr. 28, 2014.
Liu et al. "Single-Crystal-like Materials by the Self-Assembly of Cube-Shaped Lead Zirconate Titanate (PZT) Microcrystals", Langmuir 2005, 21, 3207-3212.
Japanese Office Action dated Feb. 9, 2016, issued in corresponding Japanese Patent Application No. 2013-035654 (English translation).
International Preliminary Report on Patentability and English translation of the Written Opinion of the International Searching Authority (forms PCT/IB/373, PCT/ISA/237 and PCT/IB/338), dated Sep. 11, 2015, for International Application No. PCT/JP2014/051698.

* cited by examiner

OXIDE PARTICLES, PIEZOELECTRIC ELEMENT, AND METHOD FOR PRODUCING OXIDE PARTICLES

CROSS-REFERENCE TO RELATED APPLICATIONS

This application is a Continuation of PCT International Application No. PCT/JP2014/051698 filed on Jan. 27, 2014, which claims priority under 35 U.S.C. § 119(a) to Japanese Patent Application No. 2013-035654 filed on Feb. 26, 2013. Each of the above application(s) is hereby expressly incorporated by reference, in its entirety, into the present application.

BACKGROUND OF THE INVENTION

The present invention relates to oxide particles having a satisfactory particle size and a satisfactory shape and also having high piezoelectric properties; a piezoelectric element produced using the oxide particles; and a method for producing the oxide particles.

As a piezoelectric material having excellent piezoelectric properties, PZT having a compositional formula of $Pb(Zr_xTi_{1-x})O_3$ has been known.

PZT has been used in various applications, such as piezoelectric actuators, piezoelectric sensors, piezoelectric buzzers, acceleration sensors, and power generation element, by utilizing its excellent piezoelectric properties.

As methods for producing such a PZT, methods by which a piezoelectric ceramic is formed by mixing raw material powders such as lead zirconate and lead titanate and then sintering, and methods using hydrothermal synthesis have been known.

As an example of the methods for producing PZT using hydrothermal synthesis, a method described in R. E. Riman et al., Langmuir 2005, 21, 3207-3212 has been known.

In this method for producing PZT, first, a raw material in which titanium oxide powder and zirconium oxychloride are dispersed in water, and another raw material in which lead acetate powder and EDTA are dispersed in water and the pH has been adjusted by potassium hydroxide are prepared. Both of the prepared raw materials are then mixed, and the mixed raw material is subjected to hydrothermal synthesis using an autoclave to produce PZT powder.

According to the method for producing PZT described in R. E. Riman et al., Langmuir 2005, 21, 3207-3212, PZT particles having a uniform size and shape that are in a several μm cube shape can be produced.

Note that, in piezoelectric materials, an MPB composition has been known as a composition that can provide high piezoelectric properties. The MPB composition of PZT is $Pb(Zr_{0.52}Ti_{0.48})O_3$.

On the other hand, the composition of PZT particles produced by the production method described in R. E. Riman et al., Langmuir 2005, 21, 3207-3212 is $Pb(Zr_{0.7}Ti_{0.3})O_3$. Because of this, the PZT particles obtained by the production method described in R. E. Riman et al., Langmuir 2005, 21, 3207-3212 have piezoelectric constant $d_{33}$ of approximately 80 to 120 pm/V, and thus high piezoelectric properties cannot be achieved.

Furthermore, when PZT of the MPB composition is produced using the production method of R. E. Riman et al., Langmuir 2005, 21, 3207-3212, the shape or size of the particles cannot be controlled, and thus PZT particles having a uniform size and shape, similarly to those with the composition of $Pb(Zr_{0.7}Ti_{0.3})O_3$ described above, cannot be obtained.

Meanwhile, R. E. Riman et al., Journal of Crystal Growth 226 (2001) 313-326 describes the method for producing PZT particles of the MPB composition via hydrothermal synthesis.

In this production method, first, zirconium propoxide and titanium isopropoxide are added to propanol to coprecipitate, thereby producing a zirconium titanium oxide precursor (ZTO precursor). Thereafter, lead acetate, TMAH, and the ZTO precursor are added to water and subjected to hydrothermal synthesis to obtain PZT particles.

According to the method for producing PZT described in R. E. Riman et al., Journal of Crystal Growth 226 (2001) 313-326, PZT particles in a several μm cube shape of the MPB composition can be obtained.

However, PZT particles produced by this method have an uneven cube shape and size variation is also large, compared to PZT particles produced by the method described in R. E. Riman et al., Langmuir 2005, 21, 3207-3212. Furthermore, this production method requires a complicated two-step process in which the ZTO precursor is produced and then subjected to hydrothermal synthesis.

Furthermore, the PZT particles obtained by this method for producing PZT have high surface porosity (porous area on the surface/surface area); and, because of this, high piezoelectric properties cannot be achieved.

As is well known, piezoelectric materials exhibit piezoelectricity when subjected to heat treatment.

Note that, the particle with high surface porosity has a large surface area and, furthermore, the porous part is considered to be defective as a structure. In PZT ceramics, volatilization of lead during firing is typically problematic, and, similarly, PZT particles having high surface porosity also readily allow volatilization of lead.

Because of this, when PZT particles having high surface porosity are heat-treated, the compositional ratio of lead to zirconium and titanium (Pb/(Zr+Ti)) in the composition after heat treatment becomes less than the compositional ratio before the heat treatment.

In PZT ceramics or the like, when the amount of lead is low (when 1>Pb/(Zr+Ti)), piezoelectric properties are typically lowered. That is, PZT having high surface porosity results in a condition where the amount of lead is insufficient due to the heat treatment, and thus tends to exhibit lower piezoelectric properties.

Meanwhile, for piezoelectric ceramics for which sintering is performed, a larger amount of lead is used, in a manner such that 1≤(Pb/(Zr+Ti)) is satisfied, in a raw material condition (preparation) before sintering to prevent the lead amount from being insufficient.

However, in production of PZT via hydrothermal synthesis, a PZT particle is a particle that is similar to a single crystal. Because of this, PZT particles produced by hydrothermal synthesis are less likely to have a region where excessive lead is absorbed, such as grain boundary in the particles, and thus excessive lead is less likely to be absorbed in the particle. As a result, even when hydrothermal synthesis is performed under a condition where excessive lead is used in the raw material stage, the composition of the synthesized PZT particles results in approximately 1≈(Pb/(Zr+Ti)). In particular, as the PZT particles are in shapes closer to a cube shape, this tendency is stronger since the PZT particles are closer to single crystals and less likely to have grain boundary.

Therefore, PZT particles having high surface porosity allow a larger amount of lead to volatilize during heat treatment. As a result, the particles after the heat treatment tend to have insufficient amount of lead, and high piezoelectric properties is less likely to be achieved even when the particle has the MPB composition.

SUMMARY OF THE INVENTION

An object of the present invention is to solve these problems in conventional technologies, and to provide PZT particles having a predetermined cube shape with uniform particle size, having low surface porosity, having the MPB composition or a composition that is close to the MPB composition, and having high piezoelectric properties; a piezoelectric element produced using the PZT particles; and a method for suitably producing the PZT particles by hydrothermal synthesis.

In order to achieve this object, oxide particles of the present invention have a compositional formula of $Pb(Zr_xTi_{1-x})O_3$, wherein x is $0.46 \leq x \leq 0.6$; wherein a size of the particle is from 0.5 to 10 μm; a porosity of a surface of the particle is 20% or less; and a shape of the particle is any one of a cube, a rectangular parallelepiped, or a truncated octahedron.

In the oxide particles of the present invention, x is preferably $0.48 \leq x \leq 0.56$ in the compositional formula.

In addition, a compositional ratio of Pb/(Zr+Ti) is preferably from 0.95 to 1.05.

Further, a surface roughness Ra is preferably 100 nm or less.

A piezoelectric element of the present invention comprises: a piezoelectric layer containing oxide particles having piezoelectricity; and electrodes that sandwich the piezoelectric layer therebetween; wherein 50% by mass or greater of the oxide particles contained in the piezoelectric layer is the oxide particles of the present invention.

In the piezoelectric element of the present invention, the piezoelectric layer is preferably formed by dispersing the oxide particles in a binder.

In addition, at least 50% of a volume of the piezoelectric layer is preferably the oxide particles.

Further, the piezoelectric layer is preferably a layer in which the oxide particles are arranged two-dimensionally, or the piezoelectric layer is formed by laminating a plurality of layers in which the oxide particles are arranged two-dimensionally.

In the present invention, a method for producing oxide particles comprises the steps of:

preparing a mixed raw material having a pH of 3 to 5, wherein the mixed raw material is obtained by mixing:

a first raw material obtained by adding at least one lead compound selected from the group consisting of chloride, nitrate, acetate, and hydroxide of lead element and hydrates thereof, and a complex forming compound that is capable of forming a complex with the lead compound, the complex forming compound having at least one of amino group or carboxyl group, to a liquid, and adding a basic substance to the liquid;

a zirconium raw material obtained by adding at least one zirconium compound selected from the group consisting of alkoxide, oxide, halide, nitrate, sulfate, and hydrolyzate of zirconium element and hydrates thereof, to a liquid; and a titanium raw material obtained by adding at least one titanium compound selected from the group consisting of alkoxide, oxide, halide, nitrate, sulfate, and hydrolyzate of titanium element and hydrates thereof, to a liquid;

in a manner that x satisfies $0.46 \leq x \leq 0.6$ in a compositional formula of $Pb(Zr_xTi_{1-x})O_3$;

aging the mixed raw material having the pH of 3 to 5 by leaving the mixed raw material for 3 minutes or longer; and performing hydrothermal synthesis after adding a basic substance to the aged mixed raw material.

In the method for producing oxide particles of the present invention, the mixed raw material is preferably prepared by preparing a second raw material obtained by adding the at least one zirconium compound as the zirconium raw material and the at least one titanium compound as the titanium raw material to a liquid; and mixing the first raw material and the second raw material.

In addition, the pH of the mixed raw material is preferably adjusted to 3 to 5 by adding an acidic substance to at least one of the zirconium raw material and the titanium raw material.

Further, the pH of the mixed raw material is preferably adjusted to 3 to 5 by adding an acidic substance to the first raw material.

In addition, the pH of the mixed raw material is preferably adjusted to 3 to 5 by adjusting an amount of the basic substance that is added to the first raw material.

Further, the pH of the mixed raw material is preferably adjusted to 3 to 5 by adding an acidic substance to the mixed raw material.

In addition, a basic substance is preferably added to the aged mixed raw material to adjust a pH of the mixed raw material to 14 to 15.5.

Further, the complex forming compound is preferably at least one selected from the group consisting of EDTA, NTA, DCTA, DTPA, EGTA, PDTA, BDTA, and derivatives thereof.

In addition, the mixed raw material is preferably prepared in a manner that the compositional ratio of Pb/(Zr+Ti) in the mixed raw material is from 1 to 1.3.

Further, the hydrothermal synthesis is preferably performed at 100 to 300° C.

In addition, heat treatment at 1250° C. or lower is preferably performed on the oxide particles obtained by the hydrothermal synthesis.

Further, the compositional ratios of Pb/(Zr+Ti) of the oxide particles before and after the heat treatment are preferably from 0.95 to 1.05.

In addition, the aging of the mixed raw material is preferably performed while the mixed raw material is stirred.

The oxide particles of the present invention as described above are PZT particles having a predetermined shape, such as a cube shape, and a predetermined size, and exhibiting excellent handleability and high piezoelectric properties (or possible to achieve high piezoelectricity by heat treatment). Therefore, the piezoelectric element of the present invention that uses such PZT particles of the present invention can be a high performance piezoelectric element due to the high piezoelectric properties of the PZT particles of the present invention.

Furthermore, by the method for producing oxide particles of the present invention, PZT particles having these excellent properties can be stably produced by hydrothermal synthesis.

DETAILED DESCRIPTION OF THE INVENTION

The oxide particles, the piezoelectric element, and the method for producing oxide particles of the present invention will be described in detail below based on preferred examples described in attached drawings.

Figure 1A:
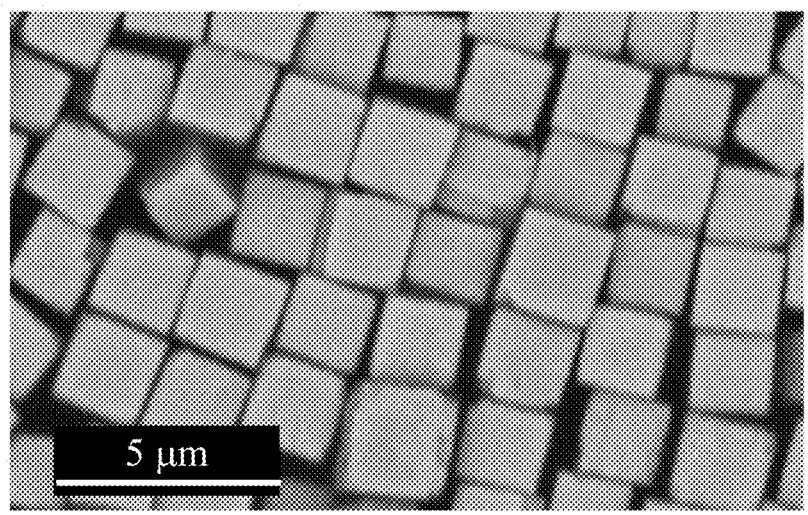
FIGS. 1A and 1B are pictures outputted by processing a photomicrograph of an example of the oxide particles of the present invention.
Figure 1A:
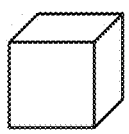
Figure 1B:
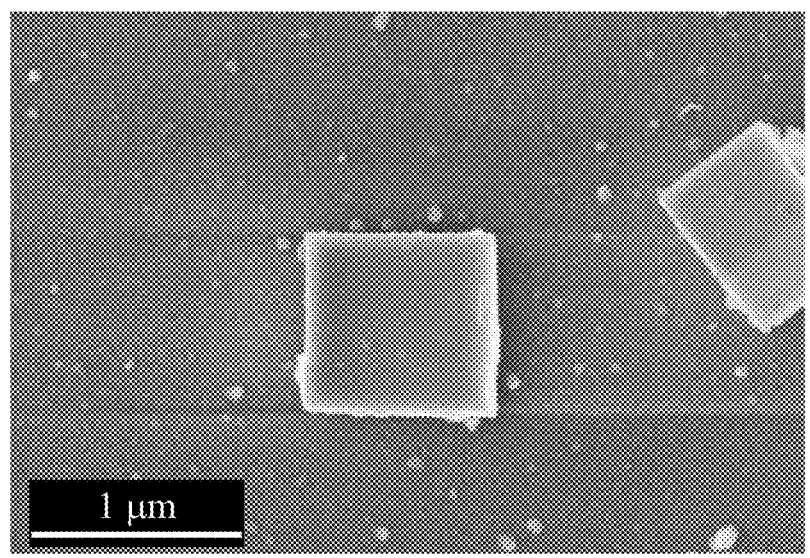

FIGS. 1A and 1B are pictures outputted by processing a picture of an example of the oxide particles of the present invention, taken by a scanning electron microscope (SEM), using a computer. This picture is taken in a condition where the surface condition of the particles can be observed well by reducing the acceleration voltage of the SEM to approximately 3 to 5 kV. Note that these oxide particles are produced by the production method of the present invention described below.

The oxide particles of the present invention are lead zirconate titanate (PZT) particles represented by a compositional formula $Pb(Zr_xTi_{1-x})O_3$, having a particle size of 0.5 to 10 µm and a shape of any one of cube shape, rectangular parallelepiped shape, or truncated octahedron shape, having surface porosity of 20% or less, and having a composition close to the morphotropic phase boundary composition (MPB composition) which satisfies $0.46 \leq x \leq 0.6$. Note that, although the standard molar ratio of the composition is Pb:(Zr+Ti):O=1:1:3, the molar ratio of the composition may deviate from the standard molar ratio within the range where the particles can take a perovskite structure.

As illustrated in FIGS. 1A and 1B, although the oxide particles of the present invention have a composition, which is close to the MPB composition, similar to the composition of PZT particles described in R. E. Riman et al., Journal of Crystal Growth 226 (2001) 313-326, the oxide particles of the present invention have significantly lower surface porosity, more uniform shape, and higher surface smoothness compared to those of PZT particles of R. E. Riman et al., Journal of Crystal Growth 226 (2001) 313-326. In the following description, the oxide particles of the present invention are also referred to as "PZT particles of the present invention."

Note that the PZT particles of the present invention may be PZT particles that have undergone heat treatment to exhibit piezoelectricity as long as the conditions described above are satisfied. Furthermore, the PZT particles of the present invention may be PZT particles that have not undergone heat treatment to exhibit piezoelectricity as long as the conditions described above are satisfied.

That is, the PZT particles (oxide particles) of the present invention that have undergone heat treatment are PZT particles having high piezoelectric properties. Furthermore, the PZT particles of the present invention that have not undergone heat treatment are PZT particles that exhibit high piezoelectric properties when heat-treated.

Such PZT particles of the present invention are PZT particles having the MPB composition (a composition close to the MPB composition), an excellent surface shape in which less holes are present on the surface, a satisfactory particle shape such as a cube shape and highly uniform size, as well as high piezoelectric properties.

As described above, PZT particles can achieve the highest piezoelectric properties when the PZT particles have the MPB composition, that is $Pb(Zr_{0.52}Ti_{0.48})O_3$. As described above, the PZT particles of the present invention have a composition where the composition satisfies $0.46 \leq x \leq 0.6$ in the compositional formula of $Pb(Zr_xTi_{1-x})O_3$.

Although PZT particles can achieve high piezoelectric properties when the composition is close to the MPB composition, when x is less than 0.46, or greater than 0.6, it is not possible to achieve desired piezoelectric properties.

Furthermore, the PZT particles of the present invention preferably have a composition that satisfies $0.48 \leq x \leq 0.56$, and particularly preferably $x \approx 0.52$ which is the MPB composition, from the perspective of achieving even higher piezoelectric properties or the like.

The PZT particles of the present invention have surface porosity of 20% or less.

Note that, in the present invention, "surface porosity of PZT particles" refers to (porous area on surface of particle/surface area of particle)×100. This surface porosity can be calculated by, for example, using an electron micrograph of PZT particles (group of PZT particles). As a specific example, a picture of PZT particles is taken in a condition where the surface condition can be observed well by reducing the acceleration voltage to approximately 3 to 5 kV in electron microscope observation. Using the picture taken in this manner, the surface porosity of the PZT particles is evaluated using an image analysis and grain size distribution measurement software. As the image analysis and grain size distribution measurement software, for example, Mac-View Ver. 4, manufactured by Mountech Co., Ltd., or the like is exemplified.

As is known, PZT particles obtained by hydrothermal synthesis exhibit piezoelectricity by performing heat treatment after the synthesis. However, as described above, when surface porosity of PZT particles is high, lead which has a low melting point volatilizes during this heat treatment. As a result, PZT particles having high surface porosity result in having insufficient amount of lead in the particles after the heat treatment, and tend to exhibit lower piezoelectric properties due to the insufficient amount of lead.

Note that, according to the research of the present inventors, even if the surface porosity is increased within the range of 0 to 20%, piezoelectric properties are not significantly lowered (also described in Examples below). On the other hand, when surface porosity is greater than 20%, the volatilized amount of lead during the heat treatment will be large, and in response to the increase in surface porosity, piezoelectric properties are significantly lowered. Because of this, when surface porosity of PZT particles is greater than 20%, for example, even when the PZT particles have the MPB composition before the heat treatment, high piezoelectric properties cannot be achieved due to insufficient amount of lead since the lead volatilizes by the heat treatment.

On the other hand, by adjusting the surface porosity to 20% or less, the PZT particles of the present invention can suppress volatilization of lead during heat treatment, and thus it is possible to stably provide PZT particles having high piezoelectric properties.

Taking this into consideration, the surface porosity is preferably 10% or less in the PZT particles of the present invention.

Furthermore, since the PZT particles of the present invention have surface porosity of 20% or less, particles having a low average surface roughness Ra, which is the average surface roughness Ra of 100 nm or less, can be obtained.

By setting the average surface roughness Ra of the PZT particles to be 100 nm or less, the surface porosity becomes low, and favorable outcomes can be obtained as described above from the perspective of volatilization of lead.

As described above, the PZT particles of the present invention have surface porosity of 20% or less. Because of this, even when the PZT particles are subjected to heat treatment, sufficient amount of lead can be retained in the particles. Note that the PZT particles of the present invention preferably have the compositional ratio of lead (element) to zirconium (element) and titanium (element), which is Pb/(Zr+Ti), of 0.95 to 1.05.

By adjusting the compositional ratio of lead to zirconium and titanium to be within this range, sufficient amount of lead can be ensured in the PZT particles to stably achieve high piezoelectric properties.

Taking this into consideration, the compositional ratio Pb/(Zr+Ti) is more preferably from 0.98 to 1.03.

Note that, as described above, since the PZT particles of the present invention have low surface porosity of 20% or less, volatilization of lead can be sufficiently suppressed even when the PZT particles are subjected to heat treatment.

Because of this, the PZT particles of the present invention can have the compositional ratio Pb/(Zr+Ti) of 0.95 to 1.05 before and after heat treatment.

Note that the PZT particles having the composition satisfying $0.46 \leq x \leq 0.6$ and the compositional ratio of Pb/(Zr+Ti) can be synthesized by adjusting the added amount of raw materials (i.e. charged amount of raw materials) corresponding to each element in the production method of the present invention described below.

The PZT particles of the present invention have a particle size of 0.5 to 10 μm.

Since the particle size is 0.5 μm or greater, deterioration of properties due to size effect is prevented, and high piezoelectric properties can be exhibited. Furthermore, since the size is from 0.5 to 10 μm, which is a suitable size, excellent usability is achieved when the PZT particles are used for piezoelectric element or the like described below.

Note that, in the present invention, "size of a particle (particle size)" of PZT particles refers to, when the shape of the PZT particles is a cube shape or rectangular parallelepiped shape, the longest length of a side of the cube or rectangular parallelepiped. For a truncated octahedron, the size of a PZT particle refers to the longest length among the distances measured from one of the six planes, which are not the eight truncated planes, to another one of the six planes that is facing the other plane.

The PZT particles of the present invention have a shape of any one of (substantially) cube shape, (substantially) rectangular parallelepiped shape, or (substantially) truncated octahedron shape. The PZT particles of the present invention illustrated in FIGS. 1A and 1B have a cube shape with a uniform size and shape.

Since the PZT particles (group of PZT particles) of the present invention thus have a uniform size and satisfactory shape, excellent usability is achieved when the PZT particles are used for piezoelectric element or the like described below.

The PZT particles of the present invention as described above have satisfactory cube shape, like the particle shape illustrated in FIGS. 1A and 1B, rectangular parallelepiped shape, or truncated octahedron shape as well as a suitable size. Because of this, for the PZT particles of the present invention, piezoelectric properties can be measured using an atomic force microscope (AFM) by arranging the particles. Specifically, a butterfly curve of ferroelectric substance is measured by using an AFM. The piezoelectric constant $d_{33}$AFM can be calculated from the slope of strain vs electric potential from the origin, which is set at 0 V, to the point at the maximum electric potential. In the present invention, the slopes are calculated in both the positive electric field and the negative electric field, and the average value thereof is used as the piezoelectric constant $d_{33}$AFM of the PZT particles.

Note that, as described above, the PZT particles of the present invention exhibit high piezoelectric properties due to the composition and surface porosity thereof. In particular, the PZT particles of the present invention preferably have the piezoelectric constant $d_{33}$AFM of 180 pm/V or greater, and more preferably 200 pm/V or greater. By setting the piezoelectric constant $d_{33}$AFM to be 180 pm/V or greater, a piezoelectric element exhibiting even higher performances can be obtained as the piezoelectric element of the present invention that uses the PZT particles of the present invention.

The piezoelectric element of the present invention is a piezoelectric element having a piezoelectric layer containing oxide particles having piezoelectricity, and electrodes that sandwich the piezoelectric layer therebetween, and 50% by mass or greater of the oxide particles contained in the piezoelectric layer is the PZT particles (oxide particles) of the present invention described above.

The piezoelectric element of the present invention is basically a publicly known piezoelectric element except that 50% by mass or greater of the oxide particles contained in the piezoelectric layer is the PZT particles of the present invention.

Figure 2A:
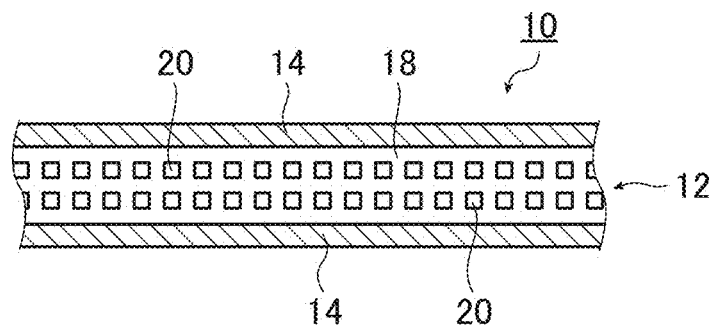
FIGS. 2A to 2C are drawings schematically illustrating an example of the piezoelectric element of the present invention.

FIG. 2A schematically illustrates an example of the piezoelectric element of the present invention.

The piezoelectric element 10 illustrated in FIG. 2A has a structure in which a piezoelectric layer 12 is sandwiched by electrodes 14. Furthermore, in the piezoelectric element 10, the piezoelectric layer 12 is formed by dispersing oxide particles 20 having piezoelectricity in a binder (matrix) 18.

Note that, in FIG. 2A, the oxide particles 20 of the piezoelectric layer 12 are schematically illustrated as being regularly arranged. However, practically, the oxide particles 20 in the piezoelectric layer 12 are irregularly and uniformly dispersed in the entire piezoelectric layer 12.

In the piezoelectric element 10 of the present invention, the binder 18 can be any dielectric binder that is used in a composite piezoelectric element formed by dispersing piezoelectric material particles in a binder. Examples of the binder include cyanoethylated polyvinyl alcohol, cyanoethylated cellulose, cyanoethylated pullulan, and the like. Furthermore, as necessary, a plurality of these may be used in a combination as the binder 18, such as a combination of cyanoethylated cellulose and cyanoethylated pullulan.

Note that, in the piezoelectric element 10 of the present invention, 50% by mass or greater of the oxide particles 20 having piezoelectricity, which is contained in the piezoelectric layer 12, is the PZT particles of the present invention described above.

As described above, the PZT particles of the present invention exhibit high piezoelectric properties. Because of this, a piezoelectric element 10 exhibiting high performances can be obtained by employing the PZT particles of the present invention in a manner that 50% by mass or greater of the oxide particles 20 in the piezoelectric layer 12 are the PZT particles of the present invention.

Furthermore, from the perspective of obtaining a piezoelectric element exhibiting even higher performances or the like, preferably, 60% by mass or greater of the oxide particles 20 contained in the piezoelectric layer 12 is the PZT particles of the present invention, and more preferably, all of the oxide particles 20 contained in the piezoelectric layer 12 is the PZT particles of the present invention.

Note that the piezoelectric layer 12 of the piezoelectric element 10 illustrated in FIG. 2A has a structure in which the oxide particles 20 are dispersed in the binder 18; however in this case, 50% or greater of the volume of the piezoelectric layer 12 is preferably the oxide particles 20. A piezoelectric element 10 exhibiting high performances can be obtained by such a structure. Furthermore, from the perspective of obtaining the piezoelectric element 10 exhibiting even higher performances or the like, more preferably, 60% or greater of the volume of the piezoelectric layer 12 is the oxide particles 20.

Furthermore, the electrode 14 can be any electrode that is used in publicly known piezoelectric elements, and the electrode 14 can be formed from copper, aluminum, gold, silver, platinum, indium tin oxide (ITO), or the like.

As described above, the PZT particles of the present invention have a satisfactory shape such as cube, rectangular parallelepiped, or truncated octahedron, and a uniform size.

In the piezoelectric element of the present invention, the piezoelectric layer may be formed by arranging the oxide particles 20 two-dimensionally instead of dispersing the oxide particles 20 in the binder by taking advantage of the shape and the size.

Figure 2B:
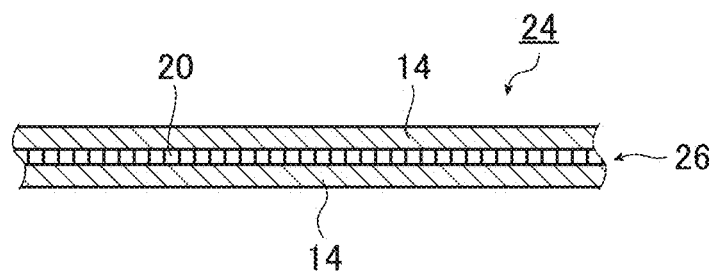

As schematically illustrated by the cube shapes of FIG. 2B, a piezoelectric element 24 having a piezoelectric layer 26 sandwiched between electrodes 14 is exemplified. In the example, the piezoelectric layer 26 is a layer in which oxide particles 20 are arranged, for example, two-dimensionally in an x-y direction.

Figure 2C:
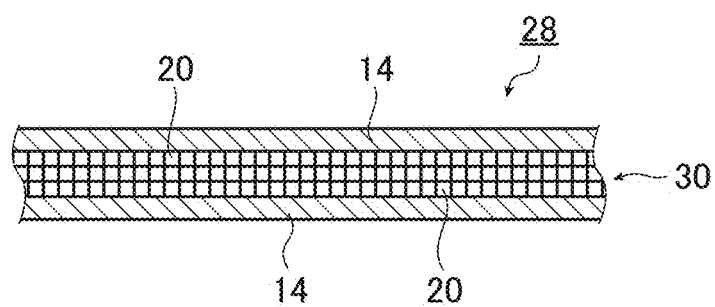

Alternatively, as schematically illustrated in the same manner by the cube shapes of FIG. 2C, a piezoelectric element 28 having a piezoelectric layer 30 being sandwiched between electrodes 14 is also exemplified. In the example, the piezoelectric layer 30 is formed by laminating a plurality of layers (in the illustrated example, three layers), in which each layer has oxide particles 20 that are arranged two-dimensionally.

As described above, the PZT particles of the present invention exhibit high piezoelectric properties. Therefore, the piezoelectric element of the present invention having the PZT particles of the present invention is a piezoelectric element exhibiting high performances.

The piezoelectric element of the present invention can be applied in various devices that use piezoelectric elements, such as piezoelectric speakers (piezoelectric sounders), piezoelectric actuators, piezoelectric sensors, and piezoelectric motors, by utilizing its excellent performances.

The PZT particles of the present invention are produced by the method for producing oxide particles of the present invention.

In other words, the production method of the present invention can produce the PZT particles of the present invention that are novel and that have excellent properties as described above, that is, the PZT particles having a suitable size of 0.5 to 10 μm, and a satisfactory shape such as a cube shape, as well as having the MPB composition or a composition that is close to the MPB composition, and a surface porosity of 20% or less.

Figure 3:
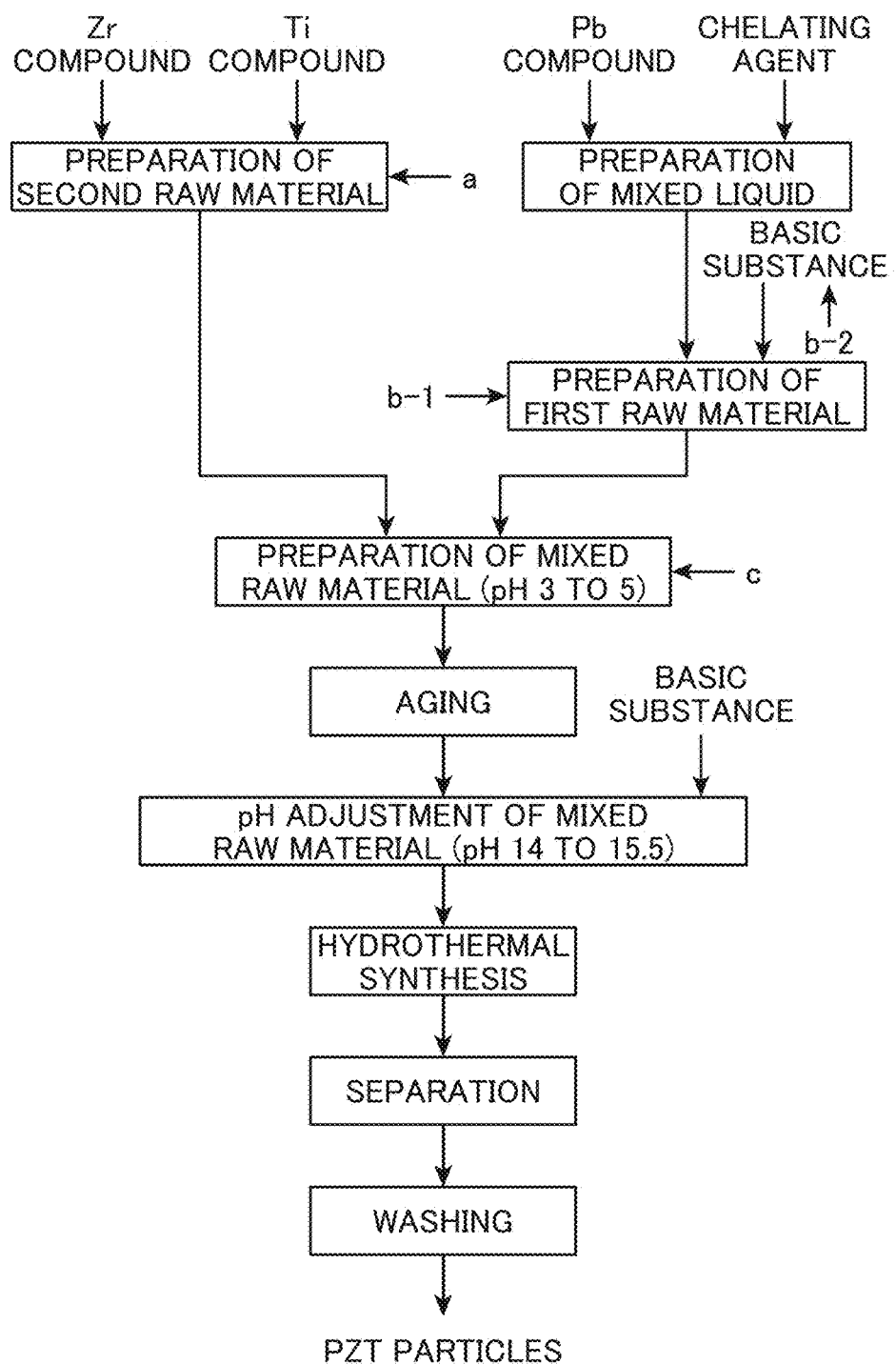
FIG. 3 is a flowchart for describing an example of the method for producing oxide particles of the present invention.

FIG. 3 illustrates a flowchart of an example of the production method of the present invention.

First, at least one lead compound (Pb compound) selected from the group consisting of chloride, nitrate, acetate, and hydroxide of lead element and hydrate thereof is provided.

Any of the compounds described above can be used as the lead compound; however, preferable examples include lead acetate and lead nitrate as well as hydrates of these, and the like.

Although a plurality of lead compounds may be used, one type of lead compound is typically used.

Also, a compound that is capable of forming a complex with the lead compound (complex forming compound) having an amino group and/or a carboxyl group is provided. In the following description, the compound that is capable of forming a complex with the lead compound is also referred to as "chelating agent."

The chelating agent can be any chelating agent that is publicly known and capable of forming a complex with the lead compound described above. Specifically, preferable examples include ethylenediaminetetraacetic acid (EDTA), nitrilotriacetic acid (NTA), trans-1,2-diaminocyclohexanetetraacetic acid (DCTA), diethylenetriaminepentaacetic acid (DTPA), bis-(aminoethyl)glycol ether-N,N,N', N'-tetraacetic acid (EGTA), propylenediaminetetraacetic acid (PDTA), 2,3-diaminobutane-N,N,N',N'-tetraacetic acid (BDTA), derivatives of these, and the like.

Although a plurality of chelating agents may be used, one type of chelating agent is typically used.

The amount of the chelating agent may be appropriately selected depending on the type and amount of the lead compound, or the like. Note that, according to the research of the present inventors, the amount of the chelating agent is preferably an amount equivalent to the molar amount of the lead.

Next, the provided lead compound and chelating agent are added to a liquid and stirred to prepare a mixed liquid (suspension).

Note that examples of the liquid used in this mixed liquid include purified water (ultrapure water, ion-exchanged water, and pure water bubbled with nitrogen or the like to adjust the pH to be uniform), and the like.

Furthermore, a basic substance is added to this mixed liquid to prepare a first raw material. By adding this basic substance, a complex is formed and the suspension becomes a transparent solution. Note that the basic substance is added until the transparent solution is obtained.

The basic substance used in this step can be any basic substance as long as the basic substance can adjust the pH without affecting the reaction and the basic substance does not become an impurity in the reaction system. Specific examples include potassium hydroxide, ammonia, and the like.

Note that the basic substance may be added to the mixed liquid as a solid, or may be added to the mixed liquid as a solution after the basic substance is dissolved in water. In either way, the basic substance is preferably added in a manner that does not cause a rapid change in pH. When the basic substance is added rapidly, the pH only around the part where the basic substance is added changes rapidly, thereby changing or decomposing the lead complex structure and discoloring the suspension. In this case, a uniform solution cannot be obtained, and uniform PZT particles may not be obtained.

Furthermore, the suspension may be gelled in the process of adding the basic substance. When the suspension is gelled, it is preferable to stop the addition of the basic substance once, stir well to crush the gel so that the gel becomes the suspension again, and then resume the addition of the basic substance. By this operation, more uniform PZT particles can be obtained.

Note that, in terms of performing the addition of the basic substance (acidic substance) in a manner that does not cause a rapid change in pH and in terms of the treatment for the case where the suspension is gelled upon addition of the basic substance (acidic substance), the same applies to the operation of adjusting the pH of the mixed raw material to 3 to 5 and to the operation of adding the basic substance to the mixed raw material after aging described below.

Meanwhile, at least one zirconium compound (Zr compound) selected from the group consisting of alkoxide, oxide, halide, nitrate, sulfate, and hydrolyzate of zirconium element, and hydrates thereof is provided.

Any of the compounds described above can be used as the zirconium compound. Specifically, preferable examples include zirconium oxychloride and zirconium oxynitrate as well as hydrates thereof, and the like.

Although a plurality of zirconium compounds may be used, one type of zirconium compound is typically used.

Furthermore, at least one titanium compound (Ti compound) selected from the group consisting of alkoxide, oxide, halide, nitrate, sulfate, and hydrolyzate of titanium element, and hydrates thereof is provided.

Any of the compounds described above can be used as the titanium compound. Specifically, preferable examples include titanium oxide, titanium chloride, titanium tetraisopropoxide, and titanium tetraethoxide as well as hydrates of these, or the like. Furthermore, when titanium oxide is used, the primary particle size of the raw material is preferably in the nanometer size.

Although a plurality of titanium compounds may be used, one type of titanium compound is typically used.

Next, the provided zirconium compound and titanium compound are added to a liquid and mixed to prepare a second raw material. Note that this mixing (stirring) is preferably performed for approximately 1 hour.

Furthermore, the liquid that can be used to prepare this second raw material can be any of various liquids, such as water, that are exemplified in the preparation of the mixed liquid described above.

Note that the second raw material is prepared in a manner that the composition of the PZT particles ($Pb(Zr_xTi_{1-x})O_3$) satisfies $0.46 \leq x \leq 0.6$. The second raw material is preferably prepared in a manner that the composition of the PZT particles satisfies $0.48 \leq x \leq 0.56$, and particularly preferably prepared in a manner that the composition of the PZT particles satisfies $x \approx 0.52$, which corresponds to the MPB composition.

That is, in the second raw material, the added amounts of the zirconium compound and the titanium compound are adjusted in a manner that the compositional ratio of the both elements satisfies $0.46 \leq x \leq 0.6$ when the amount of the zirconium element is x and the amount of the titanium element is 1-x.

Next, a mixed raw material is prepared by mixing the first raw material and the second raw material.

Note that, in the production method of the present invention, a mixed raw material having a pH of 3 to 5 is prepared. Preferably, a mixed raw material having a pH of 4 to 5 is prepared.

Specifically, at least one of the first raw material, the second raw material, or the mixed raw material is prepared in a manner that the mixed raw material obtained by mixing the first raw material and the second raw material will have a pH of 3 to 5.

An example of the method for adjusting the pH of the mixed raw material to 3 to 5 is a method in which, as indicated by arrow a in FIG. 3, an acidic substance is added to the second raw material first to lower the pH of the second raw material, and then the first raw material and the second raw material are mixed in a manner that the pH of the obtained mixed raw material becomes from 3 to 5.

The added acidic substance can be any acidic substance as long as the acidic substance can adjust the pH without affecting the reaction and the acidic substance does not become an impurity in the reaction system. Specific examples include hydrochloric acid, acetic acid, nitric acid, and the like.

Note that this acidic substance may be added as a solid, or may be added as a solution after the acidic substance is dissolved in water or the like. Note that this acidic substance is preferably added in a manner that does not cause a rapid change in pH as described above. Furthermore, when the solution is gelled, it is preferable to stop the addition of the acidic substance, crush the gel so that the gel becomes the suspension, and then resume the addition of the acidic substance.

Another example of the method for adjusting the pH of the mixed raw material to 3 to 5 is a method in which, as indicated by arrow b-1 in FIG. 3, an acidic substance is added to the first raw material to lower the pH of the first raw material, and then the first raw material and the second raw material are mixed in a manner that the pH of the obtained mixed raw material is from 3 to 5.

In the same manner as described above, the acidic substance to be added can be any acidic substance as long as the acidic substance can adjust the pH without affecting the reaction and the acidic substance does not become an impurity in the reaction system. Specific examples include the above-described acidic substances that are exemplified for the case of arrow a. This acidic substance also may be added as a solid, or may be added as a solution after the acidic substance is dissolved in water or the like. Note that this acidic substance is preferably added in a manner that does not cause a rapid change in pH as described above. Furthermore, when the solution is gelled, it is preferable to stop the addition of the acidic substance, crush the gel so that the gel becomes the suspension, and then resume the addition of the acidic substance.

Another example of the method for adjusting the pH of the mixed raw material to 3 to 5 is a method by reducing the amount of the basic substance to be added to the first raw material, as indicated by arrow b-2 in FIG. 3. That is, in the preparation of the first raw material, a basic substance is typically added in a manner that the first raw material results in a transparent solution as described above. On the other hand, this method adjusts the pH of the mixed raw material, obtained by mixing the first raw material and the second raw material, to 3 to 5 by reducing the pH of the first raw material to be low by reducing the amount of the basic substance added to the first raw material.

Furthermore, another example of the method for adjusting the pH of the mixed raw material to 3 to 5 is a method for adding an acidic substance to the mixed raw material to adjust the pH thereof to be 3 to 5, as indicated by arrow c in FIG. 3.

In the same manner as described above, the acidic substance to be added can be any acidic substance as long as the acidic substance can adjust the pH without affecting the reaction. Specific examples include the above-described acidic substances that are exemplified for the case of arrow a. This acidic substance also may be added as a solid, or may be added as a solution after the acidic substance is dissolved in water or the like. Note that this acidic substance is preferably added in a manner that does not cause a rapid change in pH as described above. Furthermore, when the solution is gelled, it is preferable to stop the addition of the acidic substance, crush the gel so that the gel becomes the suspension, and then resume the addition of the acidic substance.

Only one of these controlling methods for pH of the mixed raw material may be performed so that the pH of the mixed raw material obtained by mixing the first raw material and the second raw material to be 3 to 5, that is, for example, only the addition of the acidic substance to the second raw material indicated by the arrow a is performed.

Alternatively, two or more methods may be used in a combination so that the pH of the mixed raw material obtained by mixing the first raw material and the second raw material to be 3 to 5, that is, the addition of the acidic substance to the second raw material indicated by the arrow a and the reduction of the amount of the basic substance to be added to the first raw material indicated by the arrow b-2 are performed in a combination.

Such a mixed raw material is preferably prepared by adjusting the amounts of the first raw material and the second raw material in a manner that the compositional ratio of lead element to zirconium element and titanium element, Pb/(Zr+Ti), becomes 1 to 1.3.

Because of this, the above-described desirable PZT particles having the compositional ratio of lead to zirconium and titanium, Pb/(Zr+Ti), of 0.95 to 1.05 can be suitably produced.

After the mixed raw material having a pH of 3 to 5 is prepared in this manner, the mixed raw material is aged by leaving this mixed raw material having a pH of 3 to 5 for 3 minutes or longer.

By adding a chelating agent to a first raw material containing a Pb compound, preparing a mixed raw material containing a lead compound, a zirconium compound, and a titanium compound in a manner that the pH thereof becomes 3 to 5, and aging the mixed raw material having a pH of 3 to 5 by leaving the mixed raw material for 3 minutes or longer as described above, the production method of the present invention enables the production of the PZT particles of the present invention that are novel and that have excellent properties as described above, that is, the PZT particles having a suitable size, which is 0.5 to 10 µm, and a satisfactory shape such as a cube shape, as well as having the MPB composition (a composition that is close to the MPB composition), and a surface porosity of 20% or less.

The aging time of the mixed raw material is preferably 5 minutes or longer. Because of this, the PZT particles of the present invention described above can be produced more stably by utilizing the effect of aging sufficiently.

Note that, when the aging time is too long, it is not possible to obtain further effect of aging and it is disadvantageous from the perspectives of productivity, cost, and the like. Taking this into consideration, the aging is preferably performed for 30 minutes or shorter.

Furthermore, the aging of the mixed raw material may be basically performed at room temperature. However, since exothermic reaction or endothermic reaction also may be caused, if possible, the aging is preferably performed at a constant temperature.

Note that the aging of the mixed raw material having a pH of 3 to 5 is preferably performed while the mixed raw material is stirred. That is, since the mixed raw material is a liquid in which particles are dispersed, the aging of the mixed raw material is preferably performed while the mixed raw material is stirred so that the precipitation of the particles is avoided and the condition of the suspension is maintained.

By performing the aging while stirring, uniform reaction can be promoted between the lead compound, and the zirconium compound and the titanium compound, thereby making it possible to more stably produce the PZT particles with the desired composition.

After the completion of the aging of the mixed raw material having a pH of 3 to 5 in this manner, a basic substance is added to the mixed raw material. The basic substance can be any basic substance as long as the basic substance can adjust the pH without affecting the reaction. Specific examples thereof include the basic substances that are exemplified for the preparation of the first raw material as described above.

Note that the addition of this basic substance is preferably performed in a manner that the pH of the mixed raw material becomes 14 to 15.5. Furthermore, the addition of this basic substance is more preferably performed in a manner that the pH of the mixed raw material becomes 14.5 to 15.2.

Because of this, favorable outcomes can be obtained from the perspective of more stably producing the PZT particles of the present invention, or the like.

This basic substance also may be added as a solid, or may be added as a solution after the basic substance is dissolved in water or the like. Note that this basic substance is preferably added in a manner that does not cause a rapid change in pH as described above. Furthermore, when the solution is gelled, it is preferable to stop the addition of the basic substance, crush the gel so that the gel becomes the suspension, and then resume the addition of the basic substance.

After the pH of the mixed raw material is adjusted to 14 to 15.5, this mixed raw material is transferred to an autoclave or the like to perform hydrothermal synthesis (hydrothermal reaction) to synthesize PZT.

The hydrothermal synthesis is preferably performed at 100 to 300° C. Furthermore, the hydrothermal synthesis is more preferably performed at 100 to 200° C., and particularly preferably performed at 150 to 165° C.

Because of this, favorable outcomes can be obtained from the perspectives of more stably producing the PZT particles of the present invention, and the like.

The pressure of the hydrothermal synthesis is basically selected depending on the amount of the mixed raw material and the reaction temperature. Note that, according to the research of the present inventors, the pressure of the hydrothermal synthesis is preferably from 0.5 to 1.5 MPa.

Furthermore, the time period of the hydrothermal synthesis may be suitably set depending on the amount of each raw material, the size of the reaction apparatus, and the like. Note that the time period of the hydrothermal synthesis is typically approximately from 2 to 40 hours.

After the hydrothermal synthesis is completed, the produced PZT particles are separated and washed to obtain the PZT particles of the present invention.

Note that the separation of the PZT particles may be performed by a publicly known method such as filtration and decantation. Furthermore, the washing of the PZT particles may also be performed by a publicly known method such as washing by water or acid.

After the PZT particles are produced in this manner, as necessary, heat treatment for imparting piezoelectricity to the PZT particles is performed.

The heat treatment is preferably performed at a temperature of 1250° C. or lower. When the temperature of the heat treatment is greater than 1250° C., firing proceeds, and defects may be caused such as the shape of the PZT particles being degraded by heat.

Furthermore, to sufficiently obtain the effect of the heat treatment, the temperature of the heat treatment is preferably 500° C. or higher.

Furthermore, the time period of the heat treatment may be suitably set depending on the temperature of the heat treatment, the amount of the PZT particles that are subjected to the heat treatment, the composition of the PZT particles, and the like. Note that the time period of the heat treatment is typically approximately from 10 minutes to 24 hours.

Note that the heat treatment may be performed in an air atmosphere or in an oxygen atmosphere.

Note that, as described above, the PZT particles of the present invention produced by the production method of the present invention have low surface porosity of 20% or less. Because of this, the PZT particles of the present invention can suppress volatilization of lead even when subjected to heat treatment.

Because of this, in the production method of the present invention, when the compositional ratio of Pb/(Zr+Ti) of the PZT particles before the heat treatment is from 0.95 to 1.05, the compositional ratio of Pb/(Zr+Ti) of the PZT particles after the heat treatment can be maintained in a range of 0.95 to 1.05 even when the heat treatment is performed.

Therefore, the present invention can produce PZT particles having high piezoelectric properties without causing lack of the amount of lead of the PZT particles after the heat treatment even when heat treatment is performed.

Note that the compositional ratio of zirconium to titanium in the PZT particles typically does not change before and after the heat treatment.

In the production method illustrated in FIG. 3, the mixed raw material is prepared by preparing the second raw material containing a zirconium compound and a titanium compound, and then mixing the second raw material with the first raw material. That is, in the production method illustrated in FIG. 3, as a zirconium raw material and a titanium raw material described below, the second raw material containing a zirconium compound and a titanium compound is prepared.

However, other than this method, other various method can be used as the method for preparing the mixed raw material in the present invention.

For example, the mixed raw material may be prepared by preparing a zirconium raw material formed by adding and stirring a zirconium compound in water or the like, mixing the zirconium raw material with a first raw material, preparing a titanium raw material formed by adding and stirring a titanium compound in water or the like, and then adding this titanium raw material to the mixed liquid of the zirconium raw material and the first raw material.

Alternatively, the mixed raw material may be prepared by preparing a titanium raw material formed by adding and stirring a titanium compound in water or the like, mixing the titanium raw material with a first raw material, preparing a zirconium raw material formed by adding and stirring a zirconium compound in water or the like, and then adding this zirconium raw material to the mixed liquid of the titanium raw material and the first raw material.

Note that, in these cases, an acidic substance may be added to the zirconium raw material and/or the titanium raw material, or an acidic substance may be added to the mixed liquid of the first raw material with the zirconium raw material or the titanium raw material to adjust the pH of the mixed raw material to 3 to 5; alternatively, both of these methods may be used in combination.

However, it is conceived that, when the mixed raw material is prepared by preparing the zirconium raw material and the titanium raw material separately, and then separately mixing them to the first raw material as described above, the composition (compositional ratio of titanium to zirconium) of the resulting PZT particles may result in a composition that is different from the desired composition depending on the order of mixing, difference between reactivities of zirconium, titanium, and lead, or the like.

Therefore, in the production method of the present invention, the mixed raw material is preferably prepared by preparing the second raw material containing a zirconium compound and a titanium compound, and then mixing the second raw material with the first raw material, as in the example illustrated in FIG. 3.

The oxide particles, piezoelectric element, and method for producing oxide particles of the present invention have been described above in detail; however, the present invention is not limited to the examples described above and various improvements or modifications may be made within a range which does not depart from the gist of the present invention as a matter of course.

EXAMPLES

The present invention will be described in further detail below using specific examples of the present inventions.

Example 1

Lead acetate trihydrate (3.76 g; manufactured by Wako Pure Chemical Industries, Ltd.) and $H_4EDTA$ (2.91 g; manufactured by Dojindo Laboratories) were provided.

These lead acetate trihydrate and $H_4EDTA$ were added to 15 g of pure water and stirred until both of them were sufficiently dispersed to prepare a mixed liquid.

Thereafter, a first raw material was prepared by adding potassium hydroxide to this mixed liquid until it became a transparent solution. Note that the added amount of the potassium hydroxide was 2.91 g.

Separately, 1.496 g of zirconium oxychloride (manufactured by Wako Pure Chemical Industries, Ltd.) and 0.3434 g of titanium oxide powder (manufactured by Nippon Aerosil Co., Ltd.) were provided.

These zirconium oxychloride and titanium oxide powder were added to 10 g of pure water, and stirred for 1 hour to prepare a second raw material.

The first raw material and the second raw material prepared in this manner were mixed and stirred until the entire mixture became a suspension. Furthermore, hydrochloric acid was added until the pH became 3.5 to prepare a mixed raw material.

The prepared mixed raw material having a pH of approximately 3.5 was left for 10 minutes to age.

A solution formed by adding 11.88 g of potassium hydroxide to 5 mL of pure water was prepared. This solution was added to the aged mixed raw material to adjust the pH to 15.0.

Note that the addition of the potassium hydroxide solution was performed gradually so that rapid change in pH or temperature increase does not occur. Furthermore, since the suspension was gelled for several times during the addition of the potassium hydroxide solution, the addition of the potassium hydroxide solution was stopped and the gel was stirred until it was completely dispersed to be a suspension. Thereafter, the addition of the potassium hydroxide aqueous solution was resumed.

The prepared mixed raw material having a pH of approximately 15.0 was placed in a growing vessel, and this growing vessel was placed in an autoclave and sealed.

Thereafter, the mixed raw material was heated to 160° C. at a rate of temperature increase of 3° C./min to perform hydrothermal synthesis at 160° C. for 24 hours, and then cooled to room temperature at a rate of 10° C./min.

Note that stirring at 240 rpm was performed during the hydrothermal synthesis. Furthermore, the reaction pressure of the hydrothermal synthesis was 0.8 MPa.

The obtained PZT particles were filtered and washed with pure water until the pH became 7, washed with acetic acid with a pH of 3, subjected to ultrasonic cleaning, and then dried.

When the obtained PZT particles were observed using SEM, it was confirmed that the PZT particles had a size of 1 to 2 µm and a shape of cube shape as illustrated in FIGS. 1A and 1B. Furthermore, when this photomicrograph was analyzed using Mac-View (manufactured by Mountech Co., Ltd.), the surface porosity was substantially 0%.

Furthermore, when the composition and the compositional ratio of the PZT particles were measured by Inductively Coupled Plasma (ICP) composition analysis, the composition was $Pb(Zr_{0.52}Ti_{0.48})O_3$ (x=0.52 (MPB composition)), and the compositional ratio of Pb/(Zr+Ti) was 1.01.

Thereafter, the obtained PZT particles were placed in an electric furnace and heated to 800° C. at a rate of temperature increase of 10° C./min, and then heat-treated for 2 hours. Note that the heat treatment was performed in an oxygen atmosphere.

After the PZT particles were cooled to room temperature, the shape, size, and surface porosity were measured in the same manner as described above. No changes were observed compared to those before the heat treatment.

Furthermore, when the composition and the compositional ratio of the PZT particles were measured in the same manner as described above, the composition was $Pb(Zr_{0.52}Ti_{0.48})O_3$ (x=0.52 (MPB composition)), and the compositional ratio of Pb/(Zr+Ti) was 1.01. Thus, no changes were observed.

Example 2

PZT particles were produced in the same manner as in Example 1 except for changing the amount of zirconium oxychloride to 1.6151 g and the amount of titanium oxide powder to 0.3139 g, and the PZT particles were heat-treated.

The shapes, sizes, surface porosities, and compositions of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 µm, and the surface porosity was substantially 0%.

Furthermore, both of the compositions before and after the heat treatment were $Pb(Zr_{0.56}Ti_{0.44})O_3$ (x=0.56).

Example 3

PZT particles were produced in the same manner as in Example 1 except for changing the amount of zirconium oxychloride to 1.7537 g and the amount of titanium oxide powder to 0.2795 g, and the PZT particles were heat-treated.

The shapes, sizes, surface porosities, and compositions of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 µm, and the surface porosity was substantially 0%.

Furthermore, both of the compositions before and after the heat treatment were $Pb(Zr_{0.60}Ti_{0.40})O_3$ (x=0.60).

Example 4

PZT particles were produced in the same manner as in Example 1 except for changing the amount of zirconium oxychloride to 1.3831 g and the amount of titanium oxide powder to 0.3714 g, and the PZT particles were heat-treated.

The shapes, sizes, surface porosities, and compositions of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 µm, and the surface porosity was substantially 0%.

Furthermore, both of the compositions before and after the heat treatment were $Pb(Zr_{0.48}Ti_{0.52})O_3$ (x=0.48).

Example 5

PZT particles were produced in the same manner as in Example 1 except for changing the amount of zirconium oxychloride to 1.3267 g and the amount of titanium oxide powder to 0.3853 g, and the PZT particles were heat-treated.

The shapes, sizes, surface porosities, and compositions of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 µm, and the surface porosity was substantially 0%.

Furthermore, both of the compositions before and after the heat treatment were $Pb(Zr_{0.46}Ti_{0.54})O_3$ (x=0.46).

Comparative Example 1

PZT particles were produced in the same manner as in Example 1 except for changing the amount of zirconium oxychloride to 2.01 g and the amount of titanium oxide powder to 0.216 g, and the PZT particles were heat-treated.

The shapes, sizes, surface porosities, and compositions of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 µm, and the surface porosity was substantially 0%.

Furthermore, both of the compositions before and after the heat treatment were $Pb(Zr_{0.70}Ti_{0.30})O_3$ (x=0.70).

Comparative Example 2

PZT particles were produced in the same manner as in Example 1 except for changing the amount of zirconium oxychloride to 1.1414 g and the amount of titanium oxide powder to 0.4313 g, and the PZT particles were heat-treated.

The shapes, sizes, surface porosities, and compositions of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 μm, and the surface porosity was substantially 0%.

Furthermore, both of the compositions before and after the heat treatment were $Pb(Zr_{0.40}Ti_{0.60})O_3$ (x=0.40).

<Measurement of Piezoelectric Properties>

For each of the PZT particles with the compositions of Examples 1 to 5 and Comparative Examples 1 and 2 produced in this manner, the piezoelectric constant $d_{33}$AFM was measured.

The measurement of the piezoelectric constant $d_{33}$AFM was performed by producing a single particle film. Specifically, the single particle film was produced by floating monodispersion of the PZT particles that have not undergone the heat treatment on the surface of water, and then the PZT particles were transferred on a Pt/Ti/Si substrate to produce a monomolecular film (see R. E. Riman et al., Langmuir 2005, 21, 3207-3212).

A substrate on which the monomolecular film of each composition was formed was placed in a rapid thermal annealing apparatus (RTA apparatus) and heated to 800° C. at a rate of temperature increase of 100° C./min, and then heat-treated for 1 hour. Note that the heat treatment was performed in an oxygen atmosphere.

Thereafter, aluminum was deposited as an upper electrode, and a butterfly curve of ferroelectric substance was measured using an AFM. Note that, for all the examples, ten randomly selected particles were measured.

In the measurement of the butterfly curve of ferroelectric substance, the piezoelectric constant $d_{33}$AFM was measured from the slope of strain vs electric potential from the origin, which was set at 0 V, to the point at the maximum electric potential. Slopes were calculated in both the positive electric field and the negative electric field, and the average value thereof was used as the piezoelectric constant $d_{33}$AFM of the PZT particles.

Figure 4:
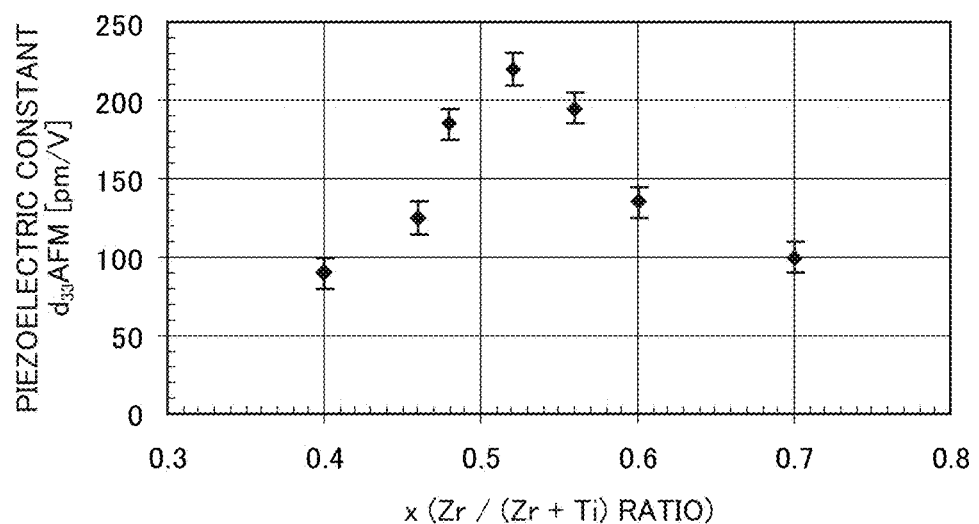
FIG. 4 is a graph illustrating the relationship between the composition of PZT particles of Examples and piezoelectric properties.
Figure 5:
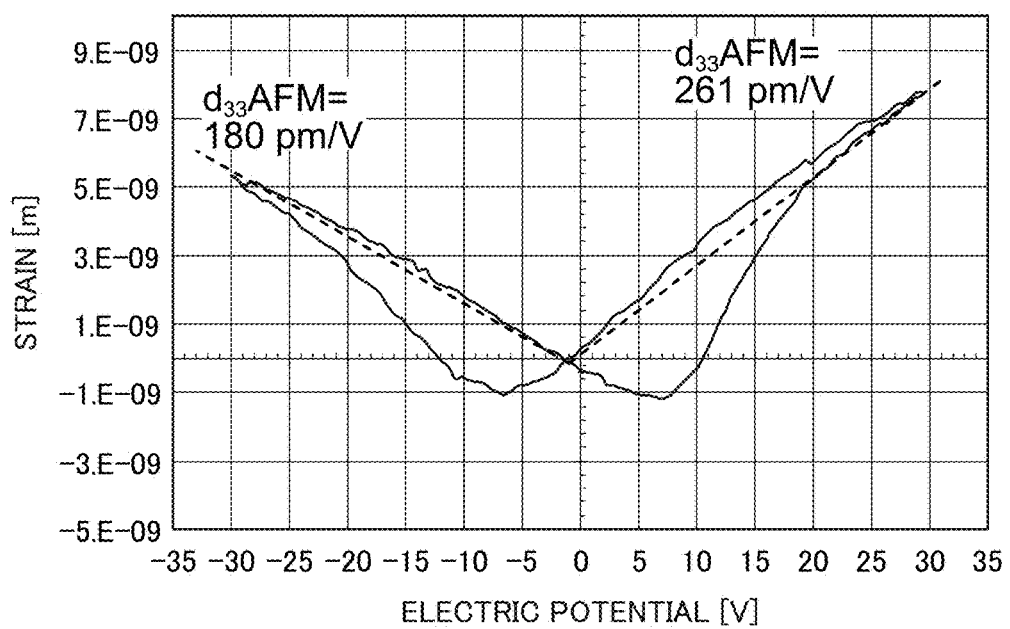
FIG. 5 is a butterfly curve in Examples.

FIG. 4 shows the relationship between the x (ratio Zr/(Zr+Ti)) and the range and median of the measured piezoelectric constant $d_{33}$ for PZT particles of Examples 1 to 5 and Comparative Examples 1 and 2. Furthermore, FIG. 5 shows the butterfly curve of the PZT particles of Example 1.

As shown in FIG. 4, all the PZT particles of the present invention having a composition satisfying 0.46≤x≤0.6 in $Pb(Zr_xTi_{1-x})O_3$ exhibit excellent piezoelectric properties with piezoelectric constants $d_{33}$AFM of 120 pm/V (median value) or greater. In particular, Examples 1, 2, and 4 having a composition satisfying 0.48≤x≤0.56 exhibit high piezoelectric properties of piezoelectric constants $d_{33}$AFM of 180 pm/V or greater. Among them, Example 1, which is the MPB composition, particularly exhibits excellent piezoelectric properties, which is 220 pm/V, as shown in FIG. 5.

On the other hand, Comparative Example 1 having the x of 0.7, and Comparative Example 2 having the x of 0.4 only exhibit low piezoelectric properties, that is, piezoelectric constants $d_{33}$AFM of 100 pm/V or less.

Example 6

PZT particles were produced in the same manner as in Example 1 except for changing the temperature of the hydrothermal synthesis to 155° C., and the PZT particles were heat-treated.

The shapes, sizes, surface porosities, compositions, and compositional ratios of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 μm, and the surface porosity was 3%.

In addition, both of the compositions before and after the heat treatment were $Pb(Zr_{0.52}Ti_{0.48})O_3$ (x=0.52).

Furthermore, the compositional ratios of Pb/(Zr+Ti) before and after the heat treatment were 1.01.

Example 7

PZT particles were produced in the same manner as in Example 1 except for changing the temperature of the hydrothermal synthesis to 165° C., and the PZT particles were heat-treated.

The shapes, sizes, surface porosities, compositions, and compositional ratios of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 μm, and the surface porosity was 20%.

Furthermore, both of the compositions before and after the heat treatment were $Pb(Zr_{0.52}Ti_{0.48})O_3$ (x=0.52).

Furthermore, the compositional ratio of Pb/(Zr+Ti) before the heat treatment was 1.01, and the compositional ratio of Pb/(Zr+Ti) after the heat treatment was 1.00.

Comparative Example 3

PZT particles were produced in the same manner as in Example 1 except for changing the temperature of the hydrothermal synthesis to 180° C., and the PZT particles were heat-treated.

The shapes, sizes, surface porosities, compositions, and compositional ratios of the obtained PZT particles before and after the heat treatment were measured in the same manner as in Example 1.

As a result, for the shapes, sizes, and surface porosities, no changes were observed before and after the heat treatment. The PZT particles had a cube shape with the size of 1 to 2 μm, and the surface porosity was 30%.

In addition, both of the compositions before and after the heat treatment were $Pb(Zr_{0.52}Ti_{0.48})O_3$ (x=0.52).

Furthermore, the compositional ratio of Pb/(Zr+Ti) before the heat treatment was 1.00, and the compositional ratio of Pb/(Zr+Ti) after the heat treatment was 0.94.

<Measurement of Piezoelectric Properties>

For each of the PZT particles with the compositions of Examples 6 and 7 and Comparative Example 3 produced in this manner, the piezoelectric constant $d_{33}$AFM was measured in the same manner as described above.

Figure 6:
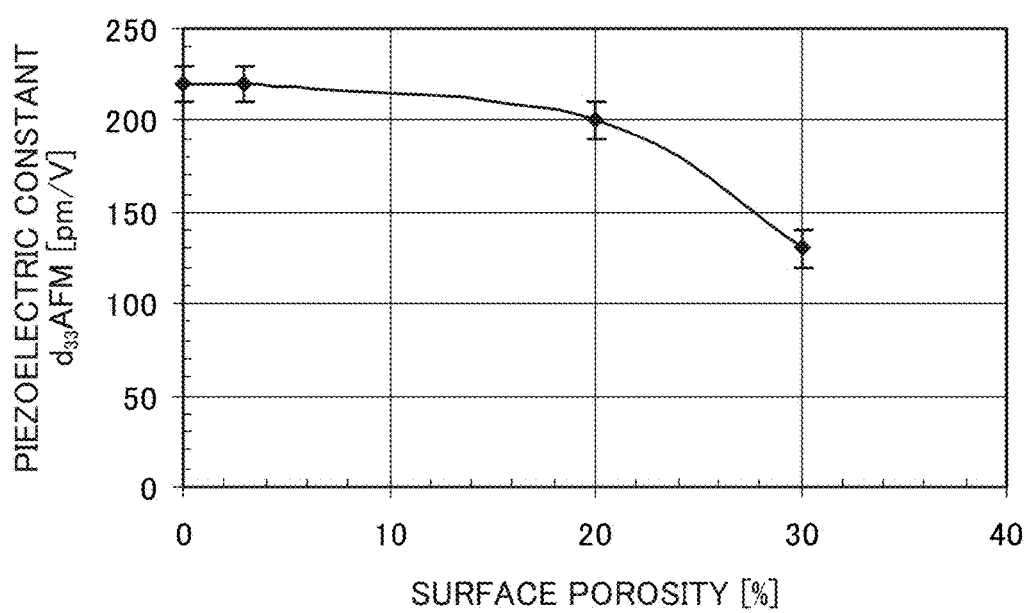
FIG. 6 is a graph illustrating the relationship between the surface porosity of PZT particles of Examples and piezoelectric properties.

FIG. 6 shows the surface porosity and the range and median of the measured piezoelectric constant $d_{33}$AFM for PZT particles of Examples 6 to 7 and Comparative Example 3. Furthermore, in FIG. 6, the result for Example 1 described above (surface porosity: substantially 0%) is also shown.

As shown in FIG. 6, the PZT particles of the present invention having the surface porosity of 20% or less shows small difference between the compositional ratios of Pb/(Zr+Ti) before and after the heat treatment. As a result, all of the PZT particles of the present invention exhibit excellent piezoelectric properties with piezoelectric constants $d_{33}$AFM of 200 pm/V (median value) or greater.

On the other hand, Comparative Example 3 having the surface porosity of 30% results in significantly lowered piezoelectric properties compared to Examples even though Comparative Example 3 was the MPB composition because the compositional ratio of Pb/(Zr+Ti) was made smaller due to the heat treatment.

Comparative Example 4

PZT particles were produced in the same manner as in Example 1 except for performing no pH adjustment and no aging of the mixed raw material obtained by mixing the first raw material and the second raw material, and the PZT particles were heat-treated. The pH of the mixed raw material immediately after mixing the first raw material and the second raw material was approximately 6.0.

Before and after the heat treatment, the obtained PZT particles were observed in the same manner as in Example 1. The shape and size were in indeterminate forms, and independent, cube shaped PZT particles were not obtained.

From the results described above, the effect of the present invention is clearly shown.

What is claimed is:

1. A piezoelectric element comprising:
   a piezoelectric layer containing oxide particles having piezoelectricity; and
   electrodes that sandwich the piezoelectric layer therebetween; wherein
   the piezoelectric layer is formed by dispersing the oxide particles in a binder;
   50% by mass or greater of the oxide particles contained in the piezoelectric layer is oxide particles having a compositional formula of $Pb(Zr_xTi_{1-x})O_3$, wherein x is $0.46 \leq x \leq 0.6$; wherein
   a size of the particle is from 0.5 to 10 µm;
   a porosity of a surface of the particle is 20% or less; and
   a shape of the particle is any one of a cube, a rectangular parallelepiped, or a truncated octahedron.

2. The piezoelectric element according to claim 1, wherein at least 50% of a volume of the piezoelectric layer is the oxide particles.

3. The piezoelectric element according to claim 1, wherein the piezoelectric layer is a layer in which the oxide particles are arranged two-dimensionally, or the piezoelectric layer is formed by laminating a plurality of layers in which the oxide particles are arranged two-dimensionally.

4. The piezoelectric element according to claim 1, wherein, in the compositional formula, x is $0.48 \leq x \leq 0.56$.

5. The piezoelectric element according to claim 1, wherein a compositional ratio of Pb/(Zr+Ti) is from 0.95 to 1.05.

6. The piezoelectric element according to claim 1, wherein a surface roughness Ra is 100 nm or less.

7. A method for producing oxide particles, the method comprising the steps of:
   preparing a mixed raw material having a pH of 3 to 5, wherein
   the mixed raw material is obtained by mixing:
   a first raw material obtained by adding
      at least one lead compound selected from the group consisting of chloride, nitrate, acetate, and hydroxide of lead element and hydrates thereof, and
      a complex forming compound that is capable of forming a complex with the lead compound, the complex forming compound having at least one of amino group or carboxyl group, to a liquid, and
      adding a basic substance to the liquid;
   a zirconium raw material obtained by adding at least one zirconium compound selected from the group consisting of alkoxide, oxide, halide, nitrate, sulfate, and hydrolyzate of zirconium element and hydrates thereof, to a liquid; and
   a titanium raw material obtained by adding at least one titanium compound selected from the group consisting of alkoxide, oxide, halide, nitrate, sulfate, and hydrolyzate of titanium element and hydrates thereof, to a liquid;
   in a manner that x satisfies $0.46 \leq x \leq 0.6$ in a compositional formula of $Pb(Zr_xTi_{1-x})O_3$;
   aging the mixed raw material having the pH of 3 to 5 by leaving the mixed raw material for 3 minutes or longer; and
   performing hydrothermal synthesis after adding a basic substance to the aged mixed raw material.

8. The method for producing oxide particles according to claim 7, wherein the mixed raw material is prepared by
   preparing a second raw material obtained by adding the at least one zirconium compound as the zirconium raw material and the at least one titanium compound as the titanium raw material to a liquid; and
   mixing the first raw material and the second raw material.

9. The method for producing oxide particles according to claim 7, wherein the pH of the mixed raw material is adjusted to 3 to 5 by adding an acidic substance to at least one of the zirconium raw material and the titanium raw material.

10. The method for producing oxide particles according to claim 7, wherein the pH of the mixed raw material is adjusted to 3 to 5 by adding an acidic substance to the first raw material.

11. The method for producing oxide particles according to claim 7, wherein the pH of the mixed raw material is adjusted to 3 to 5 by adjusting an amount of the basic substance that is added to the first raw material.

12. The method for producing oxide particles according to claim 7, wherein the pH of the mixed raw material is adjusted to 3 to 5 by adding an acidic substance to the mixed raw material.

13. The method for producing oxide particles according to claim 7, wherein a basic substance is added to the aged mixed raw material to adjust a pH of the mixed raw material to 14 to 15.5.

14. The method for producing oxide particles according to claim 7, wherein the complex forming compound is at least one selected from the group consisting of EDTA, NTA, DCTA, DTPA, EGTA, PDTA, BDTA, and derivatives thereof.

15. The method for producing oxide particles according to claim 7, wherein the mixed raw material is prepared in a manner that the compositional ratio of Pb/(Zr+Ti) in the mixed raw material is from 1 to 1.3.

16. The method for producing oxide particles according to claim 7, wherein the hydrothermal synthesis is performed at 100 to 300° C.

17. The method for producing oxide particles according to claim 7, wherein heat treatment at 1250° C. or lower is performed on the oxide particles obtained by the hydrothermal synthesis.

18. The method for producing oxide particles according to claim 17, wherein the compositional ratios of Pb/(Zr+Ti) of the oxide particles before and after the heat treatment are from 0.95 to 1.05.

19. The method for producing oxide particles according to claim 7, wherein the aging of the mixed raw material is performed while the mixed raw material is stirred.

* * * * *